US010626842B2

(12) United States Patent
Ikeoh et al.

(10) Patent No.: US 10,626,842 B2
(45) Date of Patent: Apr. 21, 2020

(54) LASER DEVICE, IGNITION DEVICE, AND INTERNAL COMBUSTION ENGINE

(71) Applicants: Toshiyuki Ikeoh, Miyagi (JP); Kentaroh Hagita, Miyagi (JP); Naoto Jikutani, Miyagi (JP); Yasuhiro Higashi, Miyagi (JP); Kazuma Izumiya, Miyagi (JP)

(72) Inventors: Toshiyuki Ikeoh, Miyagi (JP); Kentaroh Hagita, Miyagi (JP); Naoto Jikutani, Miyagi (JP); Yasuhiro Higashi, Miyagi (JP); Kazuma Izumiya, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 54 days.

(21) Appl. No.: 15/988,166

(22) Filed: May 24, 2018

(65) Prior Publication Data
US 2018/0347537 A1    Dec. 6, 2018

Related U.S. Application Data

(63) Continuation of application No. PCT/JP2016/085559, filed on Nov. 30, 2016.

(30) Foreign Application Priority Data

Dec. 2, 2015  (JP) .................. 2015-235435
May 2, 2016   (JP) .................. 2016-092223

(51) Int. Cl.
*F02P 23/04*    (2006.01)
*H01S 3/00*     (2006.01)
(Continued)

(52) U.S. Cl.
CPC ............. *F02P 23/04* (2013.01); *G02B 27/09* (2013.01); *H01S 3/00* (2013.01); *H01S 3/0941* (2013.01);
(Continued)

(58) Field of Classification Search
CPC .... F02P 23/04; G02B 27/09; H01S 3/094003; H01S 3/117; H01S 3/1611; H01S 3/1623; H01S 3/0602; H01S 3/08; H01S 2303/00
(Continued)

(56) References Cited

U.S. PATENT DOCUMENTS 6,975,663 B2   12/2005  Sekiya et al.
7,245,647 B2    7/2007  Jikutani et al.
(Continued)

FOREIGN PATENT DOCUMENTS

EP    1911967       4/2008
JP    H11-233867    8/1999
(Continued)

OTHER PUBLICATIONS

Extended European Search Report for 16870715.6 dated Dec. 5, 2018.
(Continued)

*Primary Examiner* — Joseph J Dallo
*Assistant Examiner* — Yi-Kai Wang
(74) *Attorney, Agent, or Firm* — IPUSA, PLLC

(57) ABSTRACT

A laser device includes a light source device including a semiconductor laser; and a laser cavity irradiated with light from the light source device and including a saturable absorber. A beam waist diameter r of the light that irradiates the laser cavity and an initial transmittance $T_0$ of the saturable absorber satisfy a relationship of $7.75 \times T_0^4 - 7.77 \times T_0^3 + 3.13 \times T_0^2 + 0.16 \times T_0 + 0.74 \leq r \leq 2.62 \times T_0 + 0.675$.

14 Claims, 16 Drawing Sheets

(51) Int. Cl.
*H01S 5/42* (2006.01)
*H01S 3/113* (2006.01)
*H01S 3/0941* (2006.01)
*G02B 27/09* (2006.01)
*H01S 3/094* (2006.01)
*H01S 3/117* (2006.01)
*H01S 3/16* (2006.01)
*H01S 3/06* (2006.01)
*H01S 3/08* (2006.01)

(52) U.S. Cl.
CPC ........ *H01S 3/094003* (2013.01); *H01S 3/113* (2013.01); *H01S 3/117* (2013.01); *H01S 3/1611* (2013.01); *H01S 3/1623* (2013.01); *H01S 5/42* (2013.01); *H01S 3/0602* (2013.01); *H01S 3/08* (2013.01); *H01S 2303/00* (2013.01)

(58) Field of Classification Search
USPC ...................................................... 123/143 R
See application file for complete search history.

(56) References Cited

U.S. PATENT DOCUMENTS

| | | | |
|---|---|---|---|
| 7,590,159 B2 | 9/2009 | Jikutani et al. | |
| 7,720,125 B2 | 5/2010 | Jikutani et al. | |
| 7,746,912 B2 | 6/2010 | Motomura et al. | |
| 7,981,700 B2 | 7/2011 | Sato et al. | |
| 8,035,676 B2 | 10/2011 | Harasaka et al. | |
| 8,111,725 B2 | 2/2012 | Ishii et al. | |
| 8,208,511 B2 | 6/2012 | Sato et al. | |
| 8,340,148 B2 | 12/2012 | Jikutani et al. | |
| 8,441,511 B2 | 5/2013 | Harasaka et al. | |
| 8,483,254 B2 | 7/2013 | Harasaka et al. | |
| 8,594,146 B2 | 11/2013 | Jikutani et al. | |
| 8,624,950 B2 | 1/2014 | Jikutani et al. | |
| 8,649,407 B2 | 2/2014 | Harasaka et al. | |
| 8,675,271 B2 | 3/2014 | Jikutani et al. | |
| 8,774,242 B2 | 7/2014 | Itoh et al. | |
| 8,824,517 B2 | 9/2014 | Jikutani et al. | |
| 8,855,159 B2 | 10/2014 | Sato et al. | |
| 8,891,571 B2 | 11/2014 | Jikutani et al. | |
| 8,937,982 B2 | 1/2015 | Higashi et al. | |
| 8,958,449 B2 | 2/2015 | Harasaka et al. | |
| 9,046,808 B2 | 6/2015 | Izumiya et al. | |
| 9,570,887 B2 | 2/2017 | Jikutani et al. | |
| 9,651,017 B2 | 5/2017 | Hartke et al. | |
| 9,966,730 B2 | 5/2018 | Adachi et al. | |
| 2006/0093010 A1 | 5/2006 | Sekiya et al. | |
| 2008/0078347 A1 | 4/2008 | Klausner et al. | |
| 2010/0108913 A1* | 5/2010 | Ershov .................... H01S 3/225 250/492.1 |
| 2012/0269224 A1* | 10/2012 | Nagatomo .............. H01S 5/105 372/96 |
| 2016/0094003 A1 | 3/2016 | Numata et al. | |
| 2016/0094006 A1 | 3/2016 | Hagita et al. | |
| 2016/0094009 A1 | 3/2016 | Izumiya et al. | |
| 2016/0276809 A1 | 9/2016 | Okura et al. | |
| 2018/0013257 A1* | 1/2018 | Kim ....................... F02P 23/04 |

FOREIGN PATENT DOCUMENTS

| | | | |
|---|---|---|---|
| JP | 2003-086873 | | 3/2003 |
| JP | 2009-194076 | | 8/2009 |
| JP | 2009194076 A | * | 8/2009 |
| JP | 2012047732 A | * | 3/2012 |
| JP | 2013-545280 | | 12/2013 |
| JP | 2014-150222 | | 8/2014 |
| JP | 2014-192166 | | 10/2014 |
| JP | 2015-156497 | | 8/2015 |
| JP | 2016-072610 | | 5/2016 |
| WO | 2011/154191 | | 12/2011 |

OTHER PUBLICATIONS

International Search Report dated Feb. 14, 2017 in PCT/JP2016/085559 filed on Nov. 30, 2016.

* cited by examiner

LASER DEVICE, IGNITION DEVICE, AND INTERNAL COMBUSTION ENGINE

CROSS-REFERENCE TO RELATED APPLICATION

The present application is a continuation application of International Application No. PCT/JP2016/085559 filed on Nov. 30, 2016, which claims priority to Japanese Priority Patent Application No. 2015-235435, filed on Dec. 2, 2015, and Japanese Priority Patent Application No. 2016-092223, filed on May 2, 2016, The contents of these applications are incorporated herein by reference in their entirety.

BACKGROUND OF THE INVENTION

1. Field of the Invention

The present invention relates to a laser device, an ignition device, and an internal combustion engine, and more particularly to a laser device including a laser cavity, an ignition device including the laser device, and an internal combustion engine including the ignition device.

2. Description of the Related Art

Laser devices using a laser medium that oscillates by photoexcitation, are expected to be applied to various fields such as ignition devices, laser processing machines, and medical devices.

For example, patent literature 1 discloses a laser ignition device for an internal combustion engine including a laser device including a laser-active solid body and a Q-switch circuit, and a pump light source that optically pumps the laser device.

Furthermore, patent literature 2 discloses an in-vehicle ignition device including a semiconductor laser light source and a solid-state laser medium that is excited by a semiconductor laser beam emitted by the semiconductor laser light source and that emits a pulsed laser beam for fuel ignition.

Patent Literature 1: Japanese Translation of PCT International Application Publication No. JP-T-2013-545280

Patent Literature 2: Japanese Unexamined Patent Application Publication No. 2014-192166

SUMMARY OF THE INVENTION

An aspect of the present invention provides a laser device, an ignition device, and an internal combustion engine, in which one or more of the disadvantages of the related art are reduced.

According to one aspect of the present invention, there is provided a laser device including a light source device including a semiconductor laser; and a laser cavity irradiated with light from the light source device and including a saturable absorber, wherein a beam waist diameter r of the light that irradiates the laser cavity an initial transmittance $T_0$ of the saturable absorber satisfy a relationship of $7.75 \times T_0^4 - 7.77 \times T_0^3 + 3.13 \times T_0^2 + 0.16 \times T_0 + 0.74 \leq r \leq 2.62 \times T_0 + 0.675$.

DETAILED DESCRIPTION OF THE PREFERRED EMBODIMENTS

In the laser device of the related art using a semiconductor laser as the excitation light source, it has been difficult to achieve both high laser output and high oscillation efficiency.

"Overview"

Figure 1:
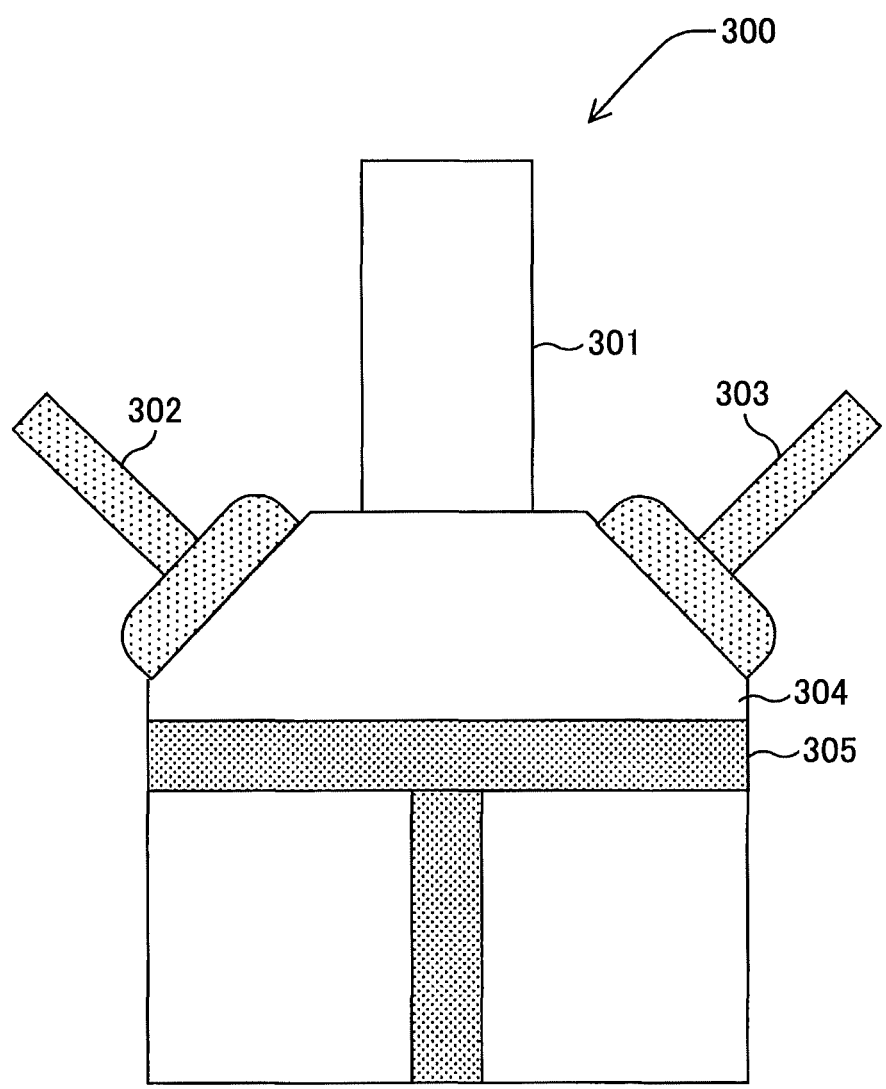
FIG. 1 is a diagram for illustrating the schematic configuration of an engine according to an embodiment of the present invention.

Hereinafter, an embodiment of the present invention will be described with reference to the accompanying drawings. FIG. 1 is a schematic diagram of a main part of an engine 300 as an internal combustion engine according to one embodiment.

The engine 300 includes an ignition device 301, a fuel injection mechanism 302, an exhaust mechanism 303, a combustion chamber 304, and a piston 305, etc.

The operations of the engine 300 will be briefly described.
(1) The fuel injection mechanism 302 injects a combustible air-fuel mixture of fuel and air into the combustion chamber 304 (intake).
(2) The piston 305 rises and compresses the combustible air-fuel mixture (compression).
(3) The ignition device 301 emits a laser beam into the combustion chamber 304. Accordingly, the fuel is ignited (ignition).
(4) Combustion gas is generated and the piston 305 descends (combustion).
(5) The exhaust mechanism 303 exhausts the combustion gas out of the combustion chamber 304 (exhaust).

As described above, a series of processes including intake, compression, ignition, combustion, and exhaust is repeated. The piston 305 moves in response to the volume change of the gas in the combustion chamber 304, to generate kinetic energy. As the fuel, for example, natural gas and gasoline, etc., is used.

Note that the engine 300 performs the above operations based on instructions from an engine control device that is provided outside the engine 300 and that is electrically connected to the engine 300.

Figure 2:
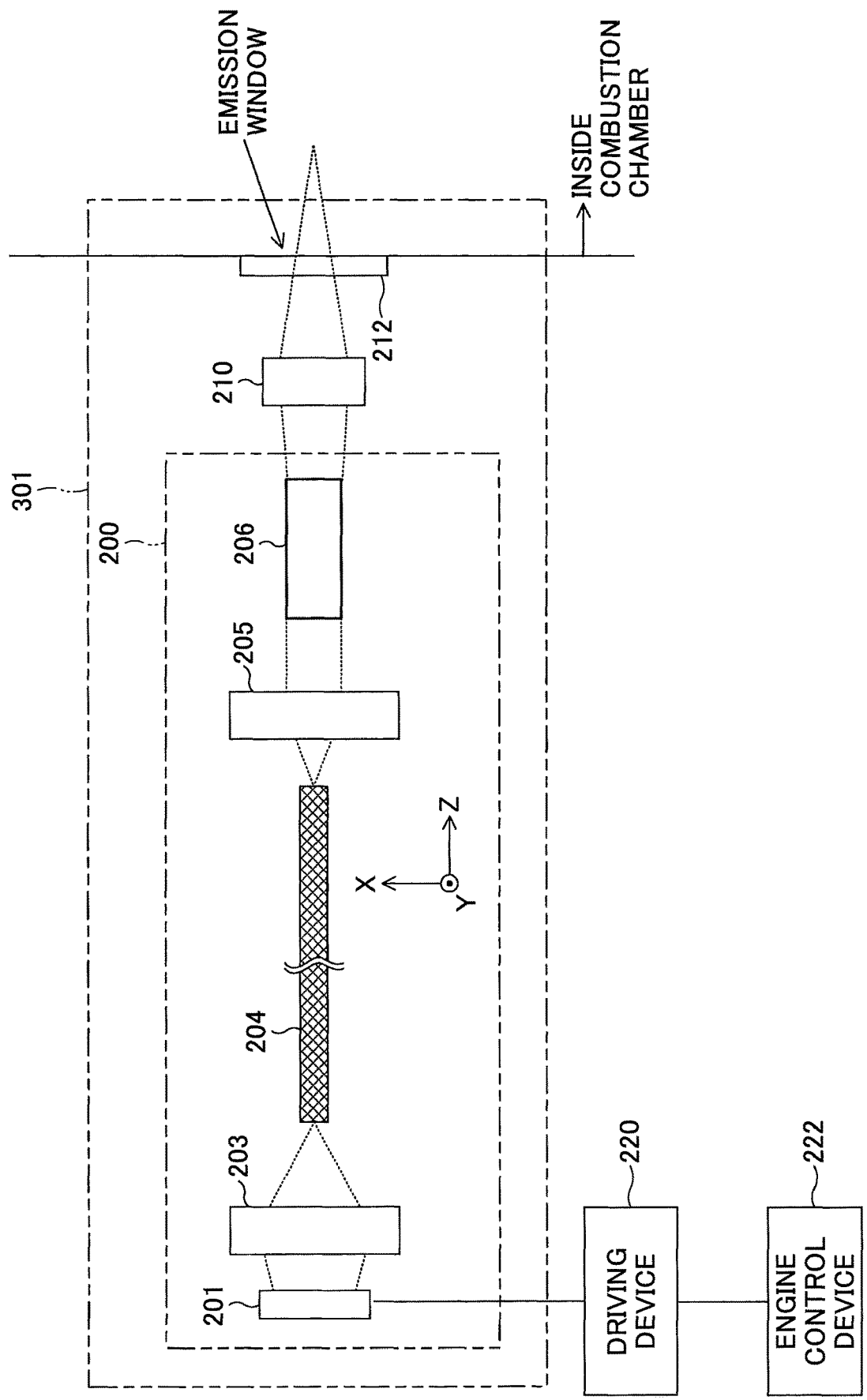
FIG. 2 is a diagram for illustrating an ignition device according to an embodiment of the present invention.

As illustrated in FIG. 2 as an example, the ignition device 301 includes a laser device 200, an emission optical system 210, and a protection window 212, etc.

The emission optical system 210 condenses the light emitted from the laser device 200. Accordingly, it is possible to obtain a high energy density at the focal point.

The protection window 212 is a transparent optics facing the combustion chamber 304. Here, as an example, sapphire glass is used as the material of the protection window 212.

The laser device 200 includes a vertical cavity surface emitting laser (VCSEL) array 201, a first light condensing optical system 203, an optical fiber 204, a second light condensing optical system 205, and a laser cavity 206. Note that in the present specification, a XYZ three-dimensional orthogonal coordinate system is used, and the light emission direction from the VCSEL array 201 is described as the +Z direction.

The VCSEL array 201 is a light source for excitation and includes a plurality of light emitting units. The wavelength of the light emitted from the VCSEL array 201 is 808 nm.

A surface emitting laser array has a characteristic that the wavelength deviation of the emitted light caused by the temperature of is extremely small, and therefore the surface emitting laser array is a light source that is advantageous for exciting a Q-switched laser whose characteristics largely change due to a shift in the excitation wavelength. Thus, when a surface emitting laser array is used as a light source for excitation, there is an advantage that temperature control of the environment can be simplified.

The first light condensing optical system 203 condenses the light emitted from the VCSEL array 201.

The optical fiber 204 is disposed such that the center of the −Z side end face of the core of the optical fiber 204 is located at a position where light is condensed by the first light condensing optical system 203. Here, as the optical fiber 204, an optical fiber having a core diameter of 1.5 mm and an NA of 0.39 is used.

By providing the optical fiber 204, it is possible to place the VCSEL array 201 at a position away from the laser cavity 206. Accordingly, it is possible to increase the degree of freedom in the arrangement design. Furthermore, when the laser device 200 is used as an ignition device, the VCSEL array 201 can be located away from the heat source, and therefore it is possible to increase the range of methods of cooling the engine 300.

The light that has entered the optical fiber 204 propagates in the core, and is emitted from the +Z side end face of the core.

The second light condensing optical system 205 is disposed on the optical path of the light emitted from the optical fiber 204, and condenses the light. The light that has been condensed by the second light condensing optical system 205 enters the laser cavity 206.

Figure 3:
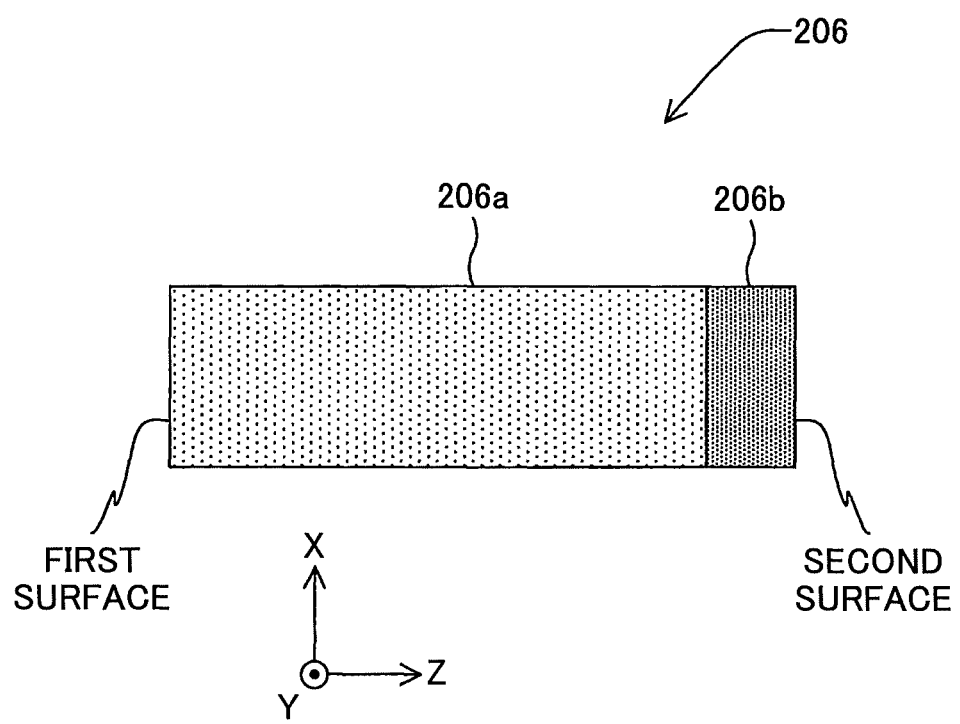
FIG. 3 is a diagram for illustrating a laser cavity according to an embodiment of the present invention.

The laser cavity 206 is a Q-switched laser, and includes, for example as illustrated in FIG. 3, a laser medium 206a and a saturable absorber 206b.

The laser medium 206a is a rectangular parallelepiped Nd:YAG crystal doped with 1.1% of Nd. The saturable absorber 206b is a rectangular parallelepiped Cr:YAG crystal, and has an initial transmittance that can be appropriately adjusted from 0.15 (15%) to 0.70 (70%).

Note that in this case, the Nd:YAG crystal and the Cr:YAG crystal are bonded to each other to form a so-called composite crystal. Furthermore, both the Nd:YAG crystal and the Cr:YAG crystal are ceramics.

The light from the second light condensing optical system 205 enters the laser medium 206a. That is, the laser medium 206a is excited by the light from the second light condensing optical system 205. Note that the wavelength of the light emitted from the VCSEL array 201 is a wavelength having the highest absorption efficiency in the YAG crystal. Furthermore, the saturable absorber 206b performs the operation of a Q-switch.

The surface on the incident side (−Z side) of the laser medium 206a and the surface on the exit side (+Z side) of the saturable absorber 206b are subjected to optical polishing processing, and serve as mirrors. Note that in the following, as a matter of convenience, the surface on the incident side of the laser medium 206a is also referred to as a "first surface", and the surface on the exit side of the saturable absorber 206b is also referred to as a "second surface" (see FIG. 3).

Furthermore, the first surface and the second surface are coated by a dielectric film, according to the wavelength of the light emitted from the VCSEL array 201 and the wavelength of the light emitted from the laser cavity 206.

Specifically, the first surface has a coating exhibiting a high transmittance with respect to light having a wavelength of 808 nm and a high reflectance with respect to light having a wavelength of 1064 nm. Furthermore, the second surface has a coating exhibiting a reflectance of approximately 50% with respect to light having a wavelength of 1064 nm.

Accordingly, the light is resonated and amplified in the laser cavity 206.

Referring back to FIG. 2, a driving device 220 drives the VCSEL array 201 based on an instruction from an engine control device 222. That is, the driving device 220 drives the VCSEL array 201 such that light is emitted from the ignition device 301 at a timing of the ignition in the operations of the engine 300. Note that the plurality of light emitting units in the VCSEL array 201 are turned on and off at the same time.

In the above embodiment, when there is no need to place the VCSEL array 201 at a position away from the laser cavity 206, the optical fiber 204 may not be provided.

Furthermore, in this case, the internal combustion engine is described as an engine (piston engine) in which the piston is moved by the combustion gas; however, the internal combustion engine is not limited as such. For example, a rotary engine, a gas turbine engine, or a jet engine may be used. In short, the internal combustion engine may be any kind of engine as long as combustion gas is generated by combusting fuel.

Furthermore, the ignition device 301 may be used for cogeneration, which is a system that utilizes waste heat to extract power, heat, and cold heat, and comprehensively increases the energy efficiency.

Furthermore, in this case, the ignition device 301 used for an internal combustion engine is described here; however, the ignition device 301 is not limited as such.

Furthermore, in this case, the laser device 200 used for the ignition device is described here; however, the laser device 200 is not limited as such. For example, the laser device 200 may be used for a laser processing machine, a laser peening device, and a terahertz generating device, etc.

"Details"

The adjustment of the focusing point in the Z axis direction of the light emitted from the laser device 200, can be performed by adjusting the focal length of the emission optical system 210 and the arrangement position of the emission optical system 210 with respect to the Z axis direction.

The VCSEL array 201 includes a plurality of light emitting units, and therefore the light output can be increased. Here, the light output of the VCSEL array 201 is approximately 400 W.

Figure 4:
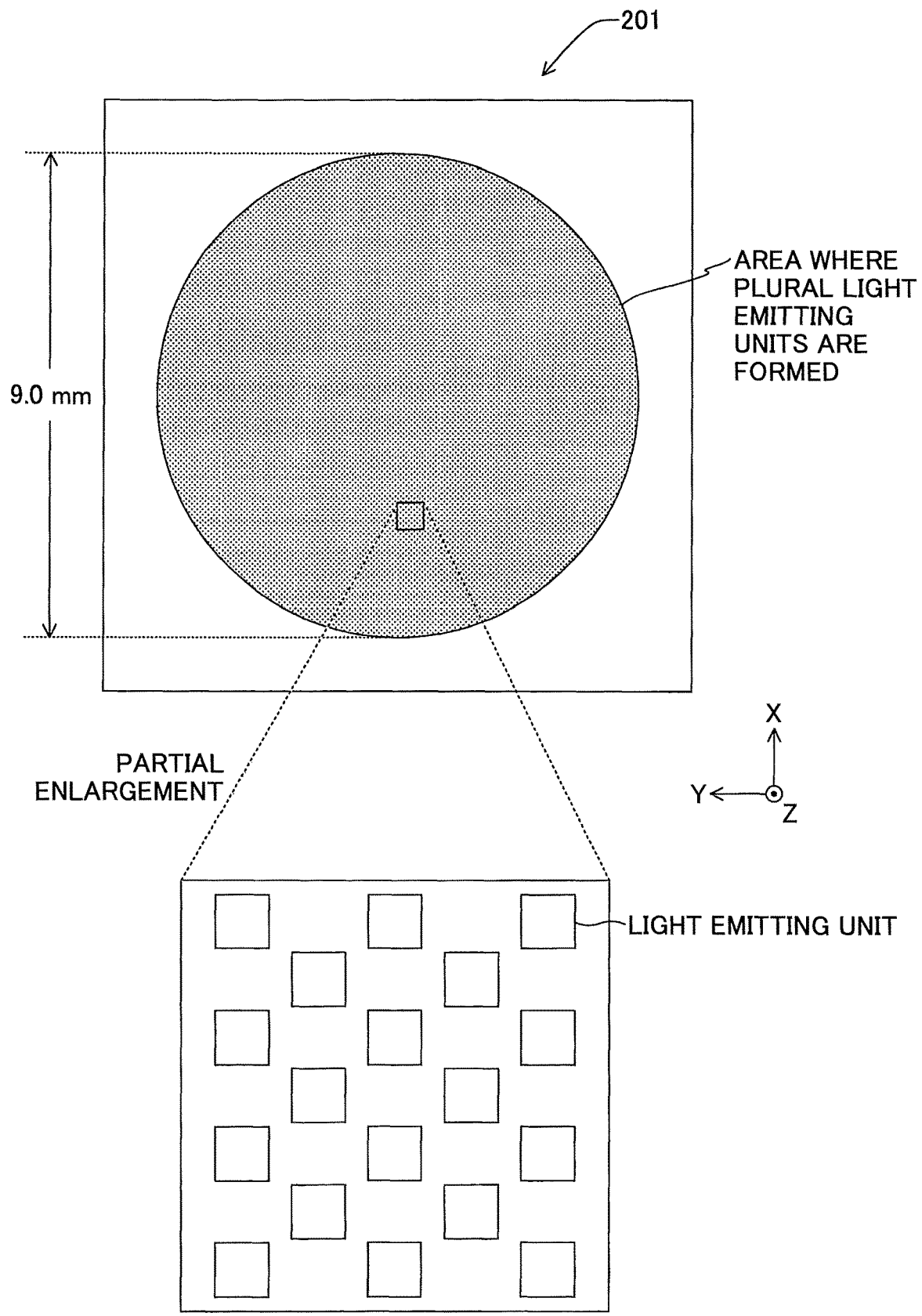
FIG. 4 is a diagram for illustrating a surface emitting laser array according to an embodiment of the present invention.

Furthermore, the plurality of light emitting units in the VCSEL array 201 are disposed in an area having a diameter of 9 mm (see FIG. 4). The length between the two farthest light emitting units in the VCSEL array 201 is greater than or equal to 7.0 mm.

The first light condensing optical system 203 includes at least one condenser lens.

By using the optical fiber 204, the length between the VCSEL array 201 and the laser cavity 206 can be increased by a length corresponding to the optical fiber 204.

Thus, when the laser device 200 is used as an ignition device of an engine, the VCSEL array 201 can be located away from a high-temperature area and a vibration area around the engine, and reliability of the ignition device can be improved.

Details of the second light condensing optical system 205 will be described.

Figure 5:
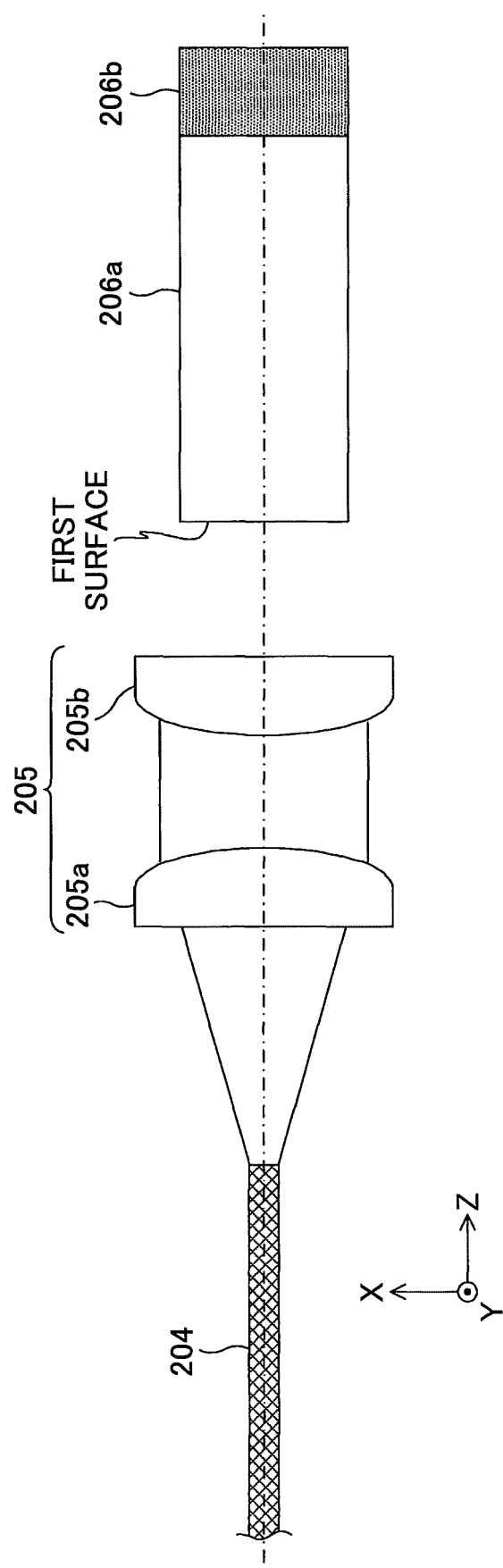
FIG. 5 is a diagram for illustrating a second light condensing optical system according to an embodiment of the present invention.

The second light condensing optical system 205 includes a plurality of optical elements. Here, the second light condensing optical system 205 includes a first lens 205a and a second lens 205b (see FIG. 5). Note that the second light condensing optical system 205 may be formed of three or more optical elements.

The first lens 205a is a collimator lens, and makes the light emitted from the optical fiber 204 substantially parallel.

Figure 6:
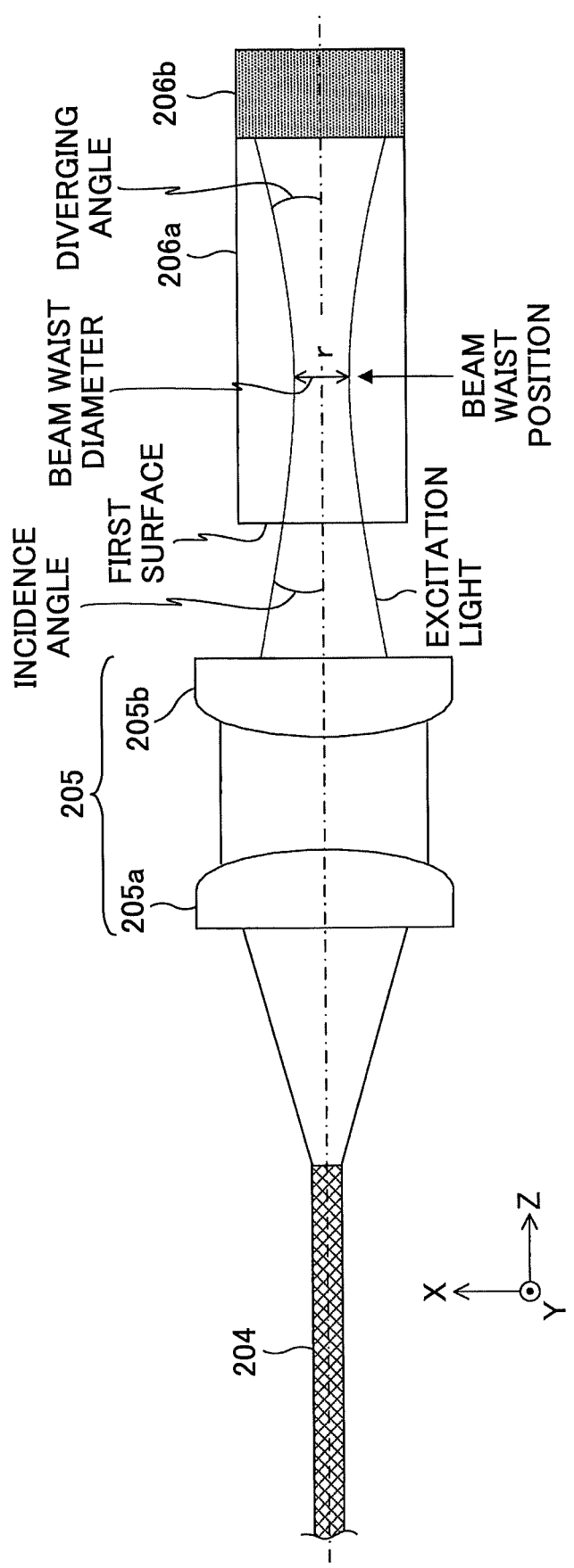
FIG. 6 is a diagram for illustrating excitation light according to an embodiment of the present invention.

The second lens 205b is a condenser lens, and condenses the light, which is made into a substantially parallel light by the first lens 205a (see FIG. 6).

Details of the laser cavity 206 will be described.

In this case, the Nd:YAG crystal and the Cr:YAG crystal are both ceramics, and therefore the productivity is higher than that of a single crystal.

Furthermore, the boundary part between the Nd:YAG crystal and the Cr:YAG crystal is not separated, and therefore characteristics equivalent to those of a single crystal are obtained, and this is advantageous in terms of mechanical strength and optical characteristics.

The light that has passed through the second lens 205b enters the laser medium 206a. That is, the laser medium 206a is excited by the light that has passed through the second lens 205b. Note that in the following description, the light that enters the laser medium 206a via the second lens 205b is also referred to as "excitation light".

Incidentally, light emitted from an edge emitting laser has a large wavelength variation with respect to temperature. Therefore, in an ignition device assumed to be used under a high temperature environment, when an edge emitting laser is used as the excitation light source, a precise temperature control mechanism for maintaining the temperature of the edge emitting laser constant is necessary, leading to an increase in size and cost of the device.

On the other hand, light emitted from a surface emitting laser array has a wavelength variation with respect to temperature, that is approximately 1/10 of that of an edge emitting laser. Thus, an ignition device using the surface emitting laser array as a light source for excitation, does not require a precise temperature control mechanism. Therefore, it is possible to achieve a compact and low-cost ignition device.

In addition, in the surface emitting laser array, the light emitting area is inside a semiconductor, and there is no concern of breakage of the end face, and the reliability of the ignition device can be improved.

In an internal combustion engine, in order to ignite fuel with a laser beam, it is necessary to condense a laser beam to generate plasma in the combustion chamber. Furthermore, in order to condense a pulsed laser beam to generate plasma, energy of greater than or equal to 2.0 mJ is required as the energy per pulse (pulse energy).

Furthermore, in the process of ignition and combustion in an internal combustion engine, in the case of emitting a laser beam of a plurality of pulses to the combustion chamber, the effects of an increase in the combustion speed and an improvement in the combustion stability, etc., can be expected, compared to the case of emitting a laser beam of a single pulse to the combustion chamber. It is therefore preferable that the ignition device includes a laser device that emits laser beams of a plurality of pulses.

Incidentally, in order to emit a plurality of pulses from the laser device, it is conceivable that the output of the excitation light source can be increased and/or the oscillation efficiency of the laser cavity can be improved; however, at the same time, an increase in the output of the excitation light source will lead to an increase in cost.

Therefore, in the laser device using the surface emitting laser array as the excitation light source, the developers have focused on the beam waist diameter of the excitation light and initial transmittance of the saturable absorber in the laser cavity, in order to efficiently oscillate the laser beams of energy required for the combustion of the internal combustion engine.

When the beam waist diameter of the excitation light is increased, the excitation range in the laser cavity is increased, the oscillation area of the laser beam is increased, and the pulse energy is increased. In this case, the excitation area increases and the power density of the excitation light (=power of the excitation light/excitation area) of the excitation light decreases, if the power is constant.

In order to oscillate the Q-switched laser, it is necessary to accumulate (excite) a certain amount or more of light in the laser cavity. Therefore, when the power density of the excitation light decreases, the time required for accumulating the light increases. That is, when the power density of the excitation light decreases, the amount of energy of the excitation light until reaching an oscillation threshold value in the Q-switched laser increases.

Then, when the amount of energy of the excitation light until reaching an oscillation threshold value in the Q-switched laser increases, the number of oscillating pulses decreases if the power of the excitation light is constant. The energy per pulse increases at this time; however, the total energy decreases, and therefore the oscillation efficiency in the laser cavity decreases.

Figure 7:
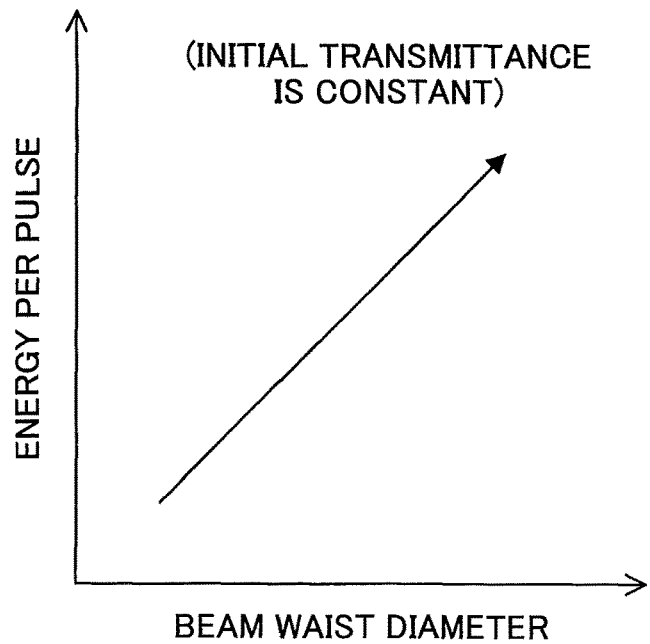
FIG. 7 is a diagram for illustrating a relationship between a beam waist diameter of excitation light and the energy per pulse output from the laser cavity, when the initial transmittance of a saturable absorber is constant according to an embodiment of the present invention.
Figure 8:
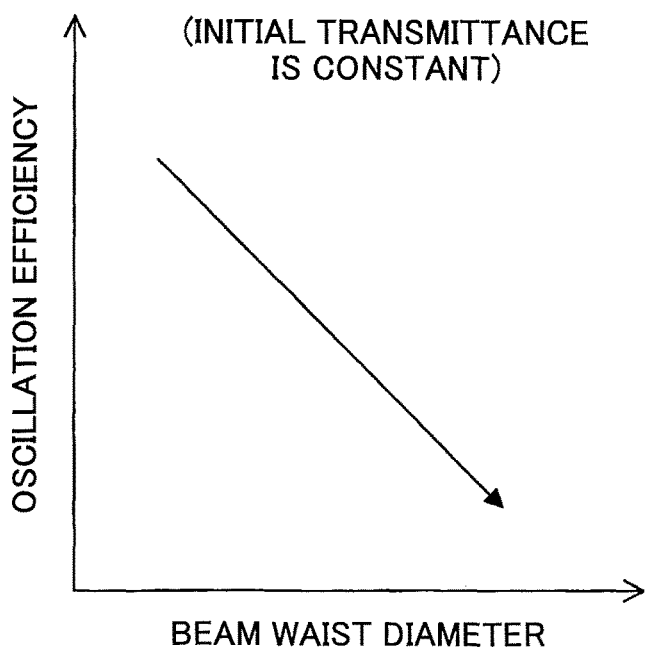
FIG. 8 is a diagram for illustrating a relationship between a beam waist diameter of excitation light and the oscillation efficiency in the laser cavity, when the initial transmittance of a saturable absorber is constant according to an embodiment of the present invention.

That is, when the initial transmittance of the saturable absorber is constant, the energy per pulse output from the laser cavity increases as the beam waist diameter of the excitation light becomes larger (see FIG. 7); however, the oscillation efficiency in the laser cavity decreases as the beam waist diameter of the excitation light becomes larger (see FIG. 8).

Note that the beam waist diameter of the excitation light is roughly determined by the core diameter of the optical fiber and the ratio of the focal length of the first lens 205*a* to the focal length of the second lens 205*b* in the second light condensing optical system 205 (focal length of the second lens 205*b*/focal length of the first lens 205*a*). Also, the beam waist diameter of the excitation light is roughly determined by the length between the optical fiber 204 and the first lens 205*a*, and the length between the first lens 205*a* and the second lens 205*b*.

On the other hand, for the saturable absorber, if the initial transmittance is increased, the amount of light required for oscillation decreases, and therefore the energy per pulse decreases. At this time, the amount of energy until reaching the oscillation threshold value in the Q-switched laser decreases.

Then, when the amount of energy until reaching the oscillation threshold value in the Q-switched laser decreases, the number of oscillating pulses increases if the power of the excitation light is constant. At this time, the energy per pulse decreases; however, the total energy increases, and therefore the oscillation efficiency is improved.

Figure 9:
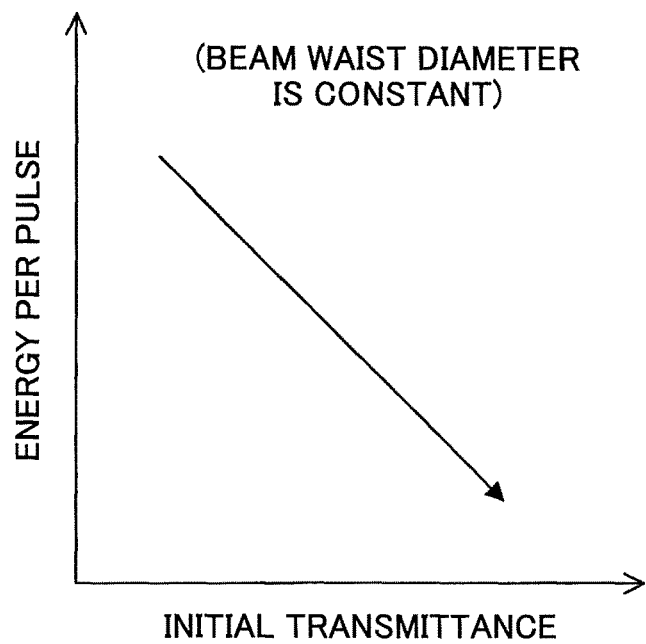
FIG. 9 is a diagram for illustrating a relationship between the initial transmittance of a saturable absorber and the energy per pulse output from the laser cavity, when a beam waist diameter of excitation light is constant according to an embodiment of the present invention.
Figure 10:
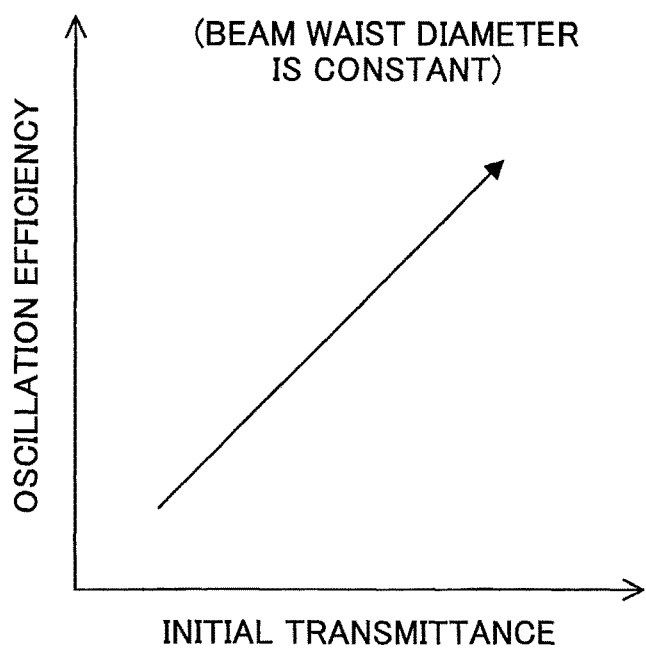
FIG. 10 is a diagram for illustrating a relationship between the initial transmittance of a saturable absorber and the oscillation efficiency in the laser cavity, when a beam waist diameter of excitation light is constant according to an embodiment of the present invention.

That is, when the beam waist diameter of the excitation light is constant, the energy per pulse output from the laser cavity decreases as the initial transmittance of the saturable absorber increases (see FIG. 9); however, the oscillation efficiency in the laser cavity increases as the initial transmittance of the saturable absorber increases (see FIG. 10).

Incidentally, the initial transmittance of the saturable absorber can be changed, by changing the concentration of Cr (chromium) in the saturable absorber and the thickness of the saturable absorber. For example, when the concentration of Cr is the same, the initial transmittance can be increased by reducing the thickness. Furthermore, when the thickness is the same, the initial transmittance can be increased by decreasing the concentration of Cr.

Figure 11:
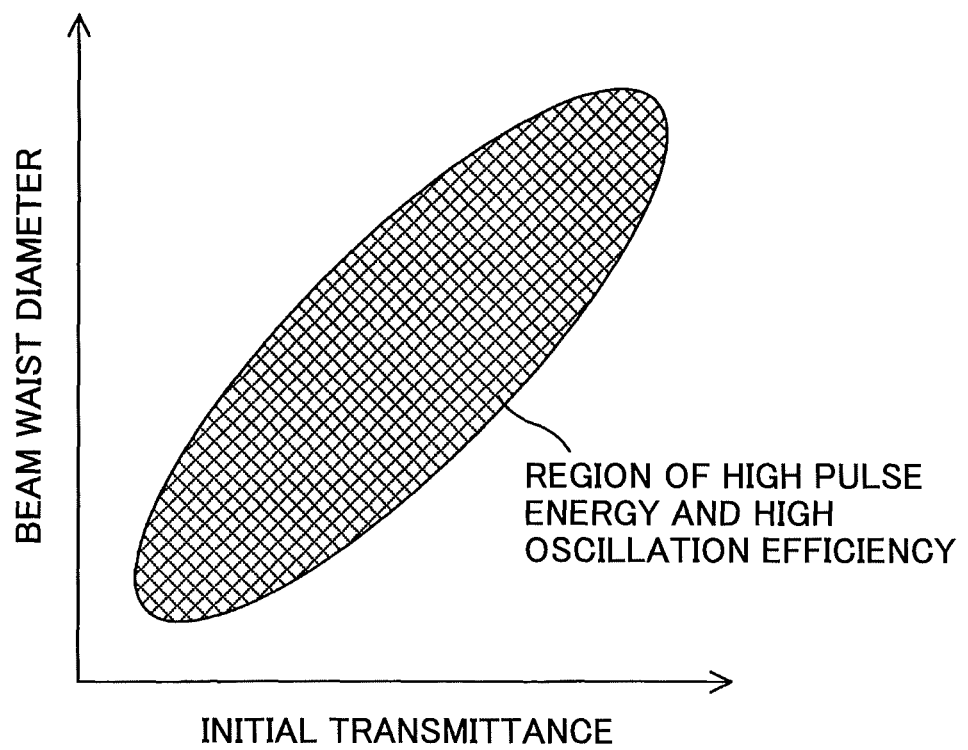
FIG. 11 is a diagram for illustrating a region where the energy per pulse output from the laser cavity and the oscillation efficiency in the laser cavity are both high, in the relationship between the initial transmittance of a saturable absorber and a beam waist diameter of excitation light according to an embodiment of the present invention.

That is, in order to increase the energy per pulse output from the laser cavity and also to increase the oscillation efficiency in the laser cavity, it is necessary to excite the laser cavity with the excitation light having an appropriate beam waist diameter with respect to the initial transmittance of the saturable absorber (see FIG. 11).

Based on the above tendencies, examples of results of various studies on combinations of the initial transmittance of the saturable absorber and the size of the beam waist diameter of the excitation light, are indicated in FIGS. 12 to 15.

Here, an objective is that the energy per pulse output from the laser cavity is greater than or equal to 2.0 mJ and the oscillation efficiency in the laser cavity is greater than or equal to 15%.

The oscillation efficiency in the laser cavity was calculated from the following formula (1).

$$\text{Oscillation efficiency} = (\text{"energy per pulse output from laser cavity"} \times \text{"number of oscillation pulses"}) \times (\text{"power of light emitted from optical fiber"} \times \text{"lighting time of surface emitting laser array"}) \times 100 \quad (1)$$

Here, the power of the light (excitation light) emitted from the optical fiber was set to 200 W. Furthermore, the lighting time of the surface emitting laser array was 500 μs.

Figure 12:
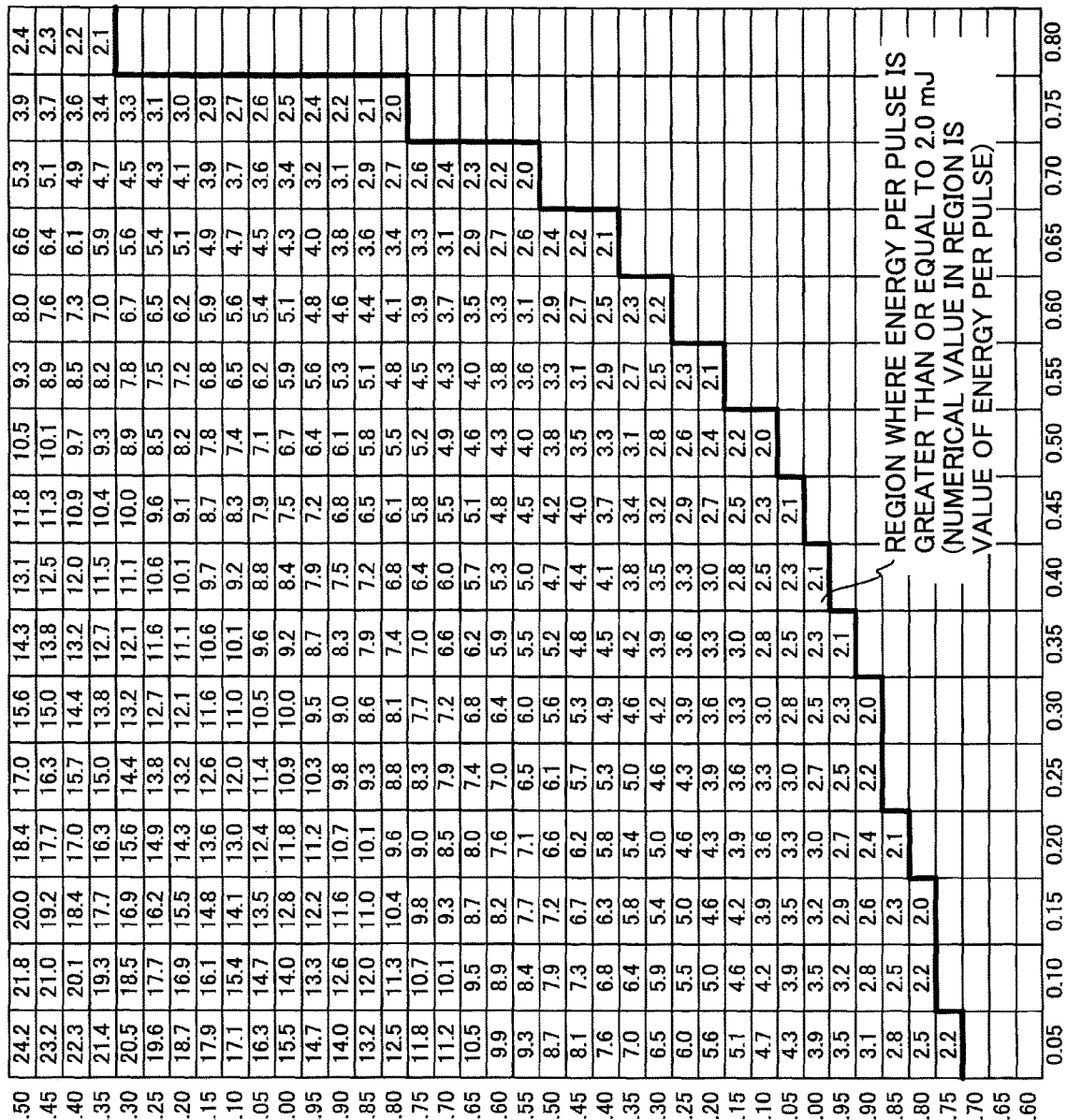
FIG. 12 is a diagram for illustrating a region where the energy per pulse output from the laser cavity is greater than or equal to 2.0 mJ, in the relationship between the initial transmittance of a saturable absorber and a beam waist diameter of excitation light according to an embodiment of the present invention.

FIG. 12 indicates a region where the energy per pulse output from the laser cavity is greater than or equal to 2.0 mJ, in the relationship between the initial transmittance of the saturable absorber and the beam waist diameter of the excitation light. Note that each of the numerical values in the region is the energy value per pulse output from the laser cavity.

Figure 13:
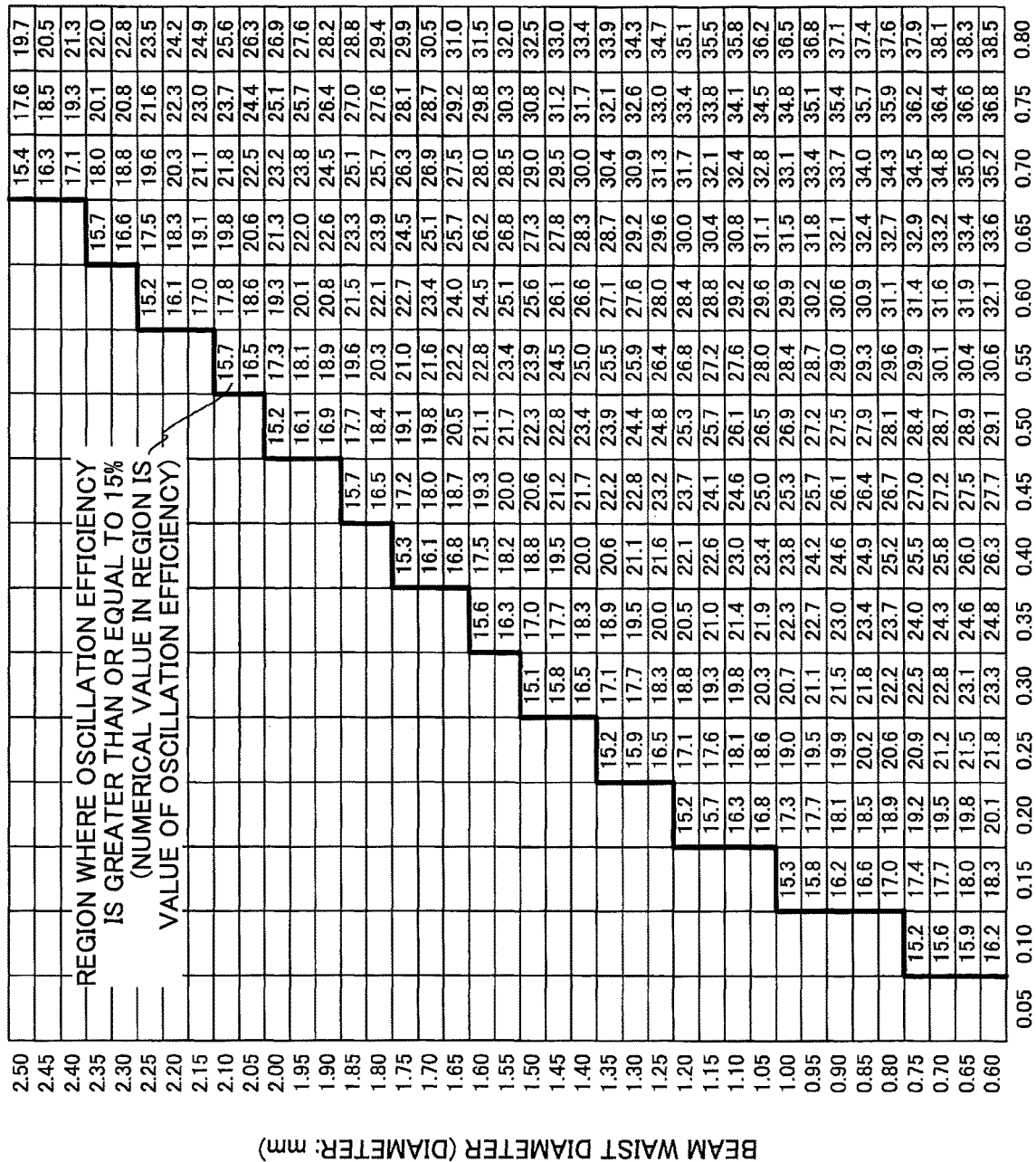
FIG. 13 is a diagram for illustrating a region where the oscillation efficiency in the laser cavity is greater than or equal to 15%, in the relationship between the initial transmittance of a saturable absorber and a beam waist diameter of excitation light according to an embodiment of the present invention.

FIG. 13 indicates a region where the oscillation efficiency in the laser cavity is greater than or equal to 15%, in the relationship between the initial transmittance of the saturable absorber and the beam waist diameter of the excitation light. Note that each of the numerical values in the region is the value of the oscillation efficiency in the laser cavity.

Figure 14:
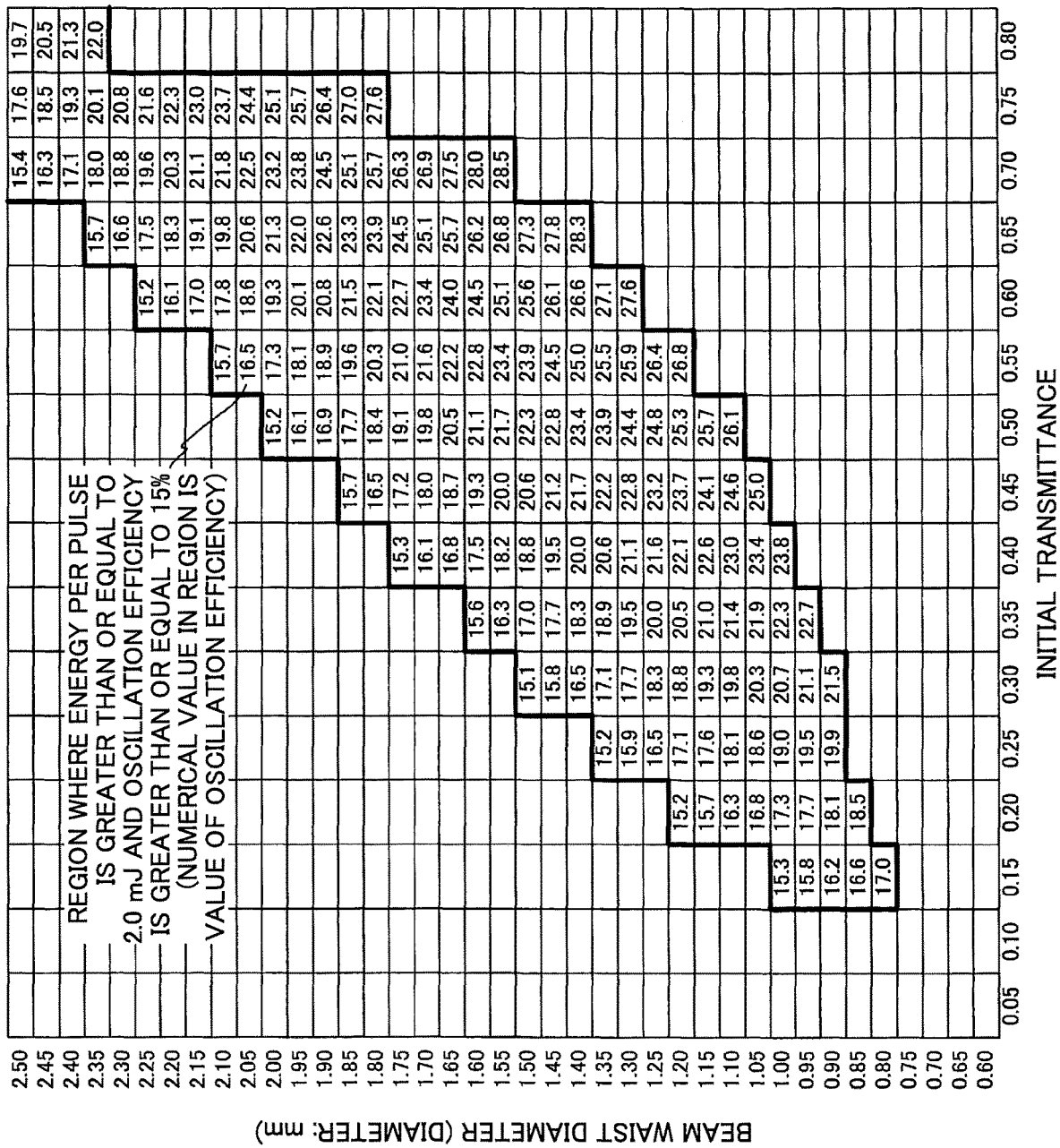
FIG. 14 is a diagram for illustrating a region where the energy per pulse output from the laser cavity is greater than or equal to 2.0 mJ and the oscillation efficiency in the laser cavity is greater than or equal to 15%, in the relationship between the initial transmittance of a saturable absorber and a beam waist diameter of excitation light according to an embodiment of the present invention.

FIG. 14 is obtained from FIGS. 12 and 13, wherein FIG. 14 indicates a region where the energy per pulse output from the laser cavity is greater than or equal to 2.0 mJ and the oscillation efficiency in the laser cavity is greater than or equal to 15%, in the relationship between the initial transmittance of the saturable absorber and the beam waist diameter of the excitation light. Note that each of the numerical values in the region is the value of the oscillation efficiency in the laser cavity.

Figure 15:
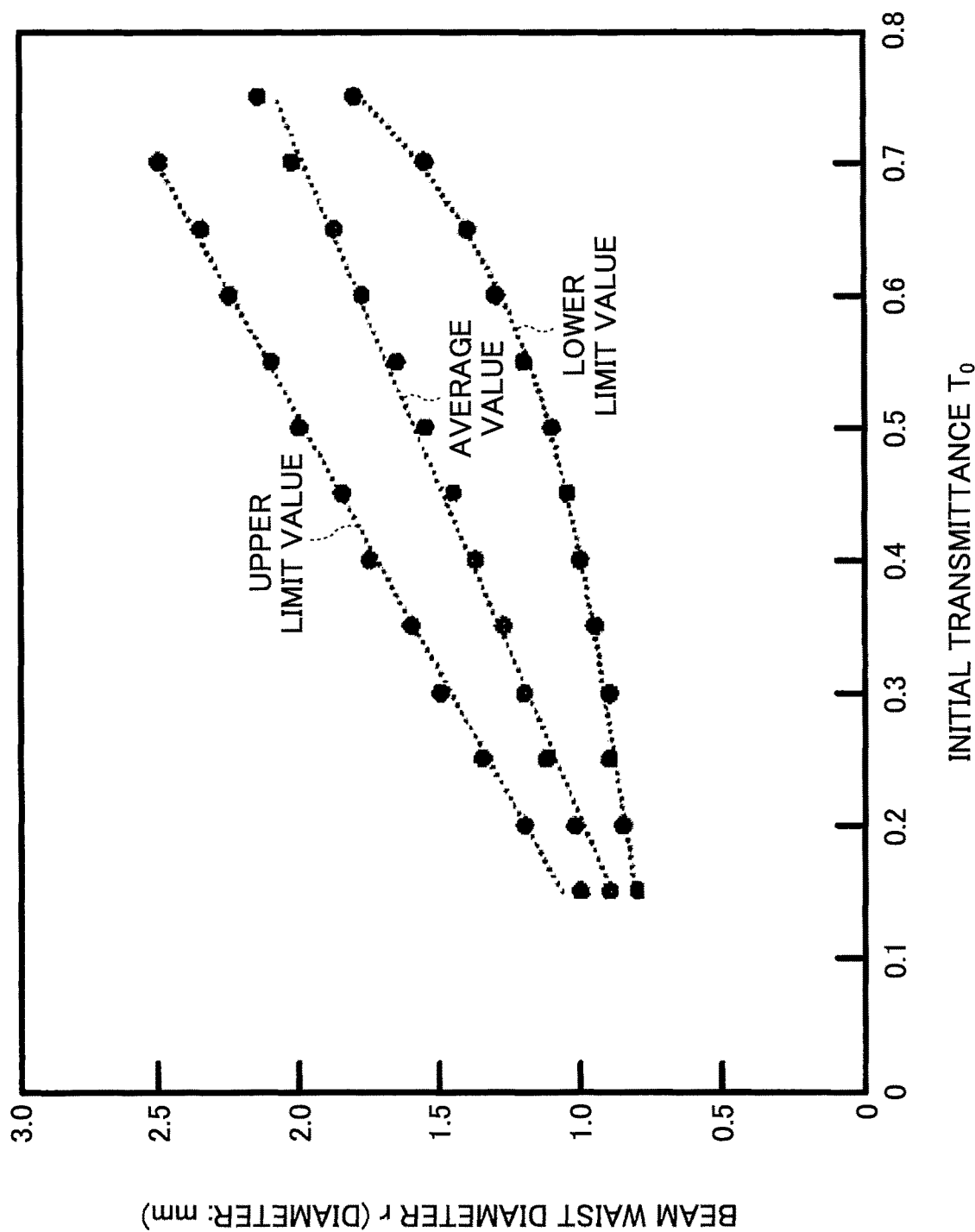
FIG. 15 is a diagram for illustrating the relationship between the upper limit value and the lower limit value of the a beam waist diameter of excitation light and the initial transmittance of a saturable absorber, in a region where the energy per pulse output from the laser cavity is greater than or equal to 2.0 mJ and the oscillation efficiency in the laser cavity is greater than or equal to 15% according to an embodiment of the present invention.

FIG. 15 indicates the relationship between the upper limit value and the lower limit value of the beam waist diameter of the excitation light and the initial transmittance of the saturable absorber, in the region where the energy per pulse output from the laser cavity is greater than or equal to 2.0 mJ and the oscillation efficiency in the laser cavity is greater than or equal to 15% indicated in FIG. 14.

Assuming that the beam waist diameter of the excitation light is r and the initial transmittance of the saturable absorber is $T_0$, and fitting is performed, the upper limit value of the beam waist diameter of the above excitation light can be expressed by the following formula (2).

$$r = 2.62 \times T_0 + 0.675 \quad (2)$$

Furthermore, similarly, when performing fitting, the lower limit value of the beam waist diameter of the above excitation light can be expressed by the following formula (3).

$$r = 7.75 \times T_0^4 - 7.77 \times T_0^3 + 3.13 \times T_0^2 + 0.16 \times T_0 + 0.74 \quad (3)$$

Therefore, in order to set the energy per pulse output from the laser cavity to greater than or equal to 2.0 mJ and to set the oscillation efficiency in the laser cavity to greater than or equal to 15%, the beam waist diameter r of the excitation light is to be set so as to satisfy a relationship of the following formula (4) with respect to the initial transmittance $T_0$ of the saturable absorber.

$$7.75 \times T_0^4 - 7.77 \times T_0^3 + 3.13 \times T_0^2 + 0.16 \times T_0 + 0.74 \leq r \leq 2.62 \times T_0 + 0.675 \quad (4)$$

That is, by setting the beam waist diameter r of the excitation light so as to satisfy the relationship of the above formula (4) with respect to the initial transmittance $T_0$ of the saturable absorber, it is possible to achieve a laser device capable of efficiently oscillating (with an oscillation efficiency of greater than or equal to 15%) the pulse energy (greater than or equal to 2.0 mJ) necessary for combustion in the internal combustion engine.

In the present embodiment, the beam waist diameter r of the excitation light is set so as to satisfy the relationship of the above formula (4) with respect to the initial transmittance $T_0$ of the saturable absorber.

Furthermore, in the present embodiment, the initial transmittance of the saturable absorber is 0.15 to 0.70. Note that when the initial transmittance of the saturable absorber exceeds 0.70, oscillation may become unstable in some cases.

Note that the size of the beam waist diameter of the excitation light for exciting the laser cavity is preferably at a magnification greater than or equal to the core diameter of the optical fiber. This is because if the excitation light is condensed to a beam diameter smaller than the core diameter of the optical fiber, the converging angle and the diverging angle in the laser cavity become larger than the diverging angle when exiting from the optical fiber. Furthermore, when the converging angle and the diverging angle become large in the laser cavity, absorption of excitation light that does not contribute to the oscillation in the laser cavity increases, and the oscillation efficiency decreases.

Figure 16A:
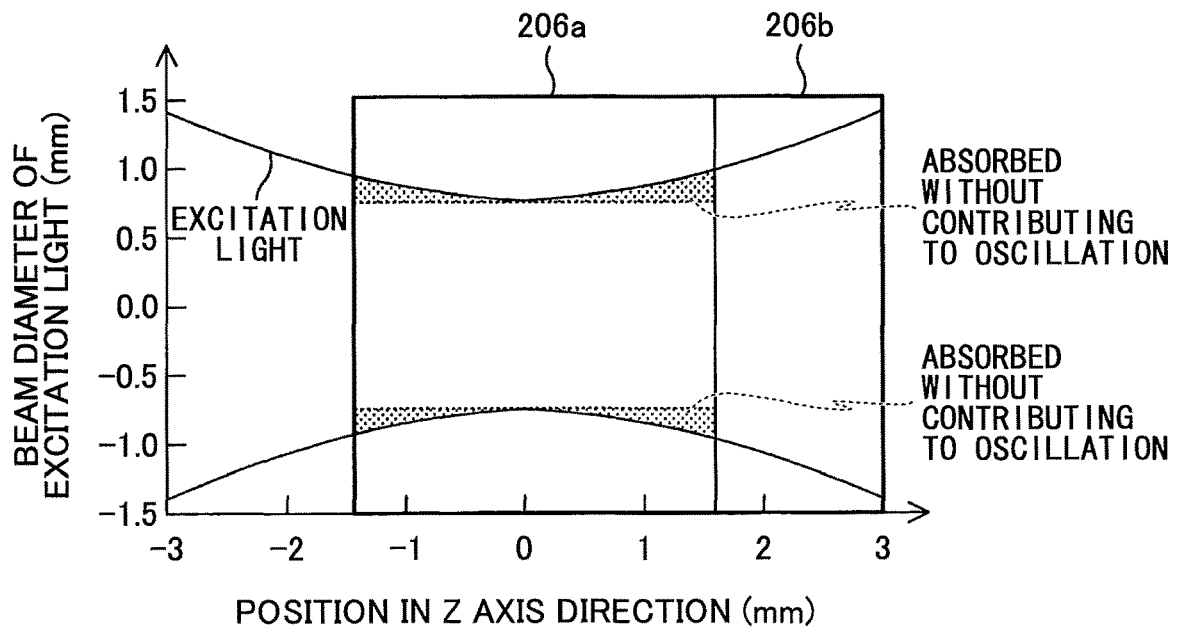
FIG. 16A is a diagram for illustrating the relationship between a beam diameter of excitation light and light that is absorbed without contributing to oscillation in the laser cavity according to an embodiment of the present invention.
Figure 16B:
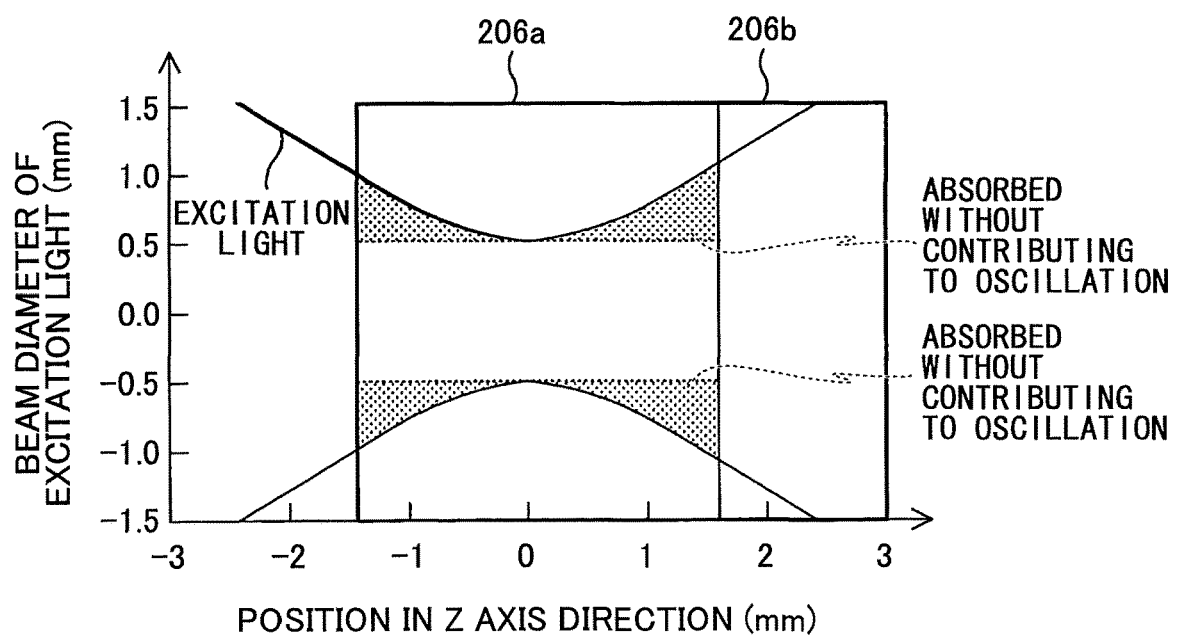
FIG. 16B is a diagram for illustrating the relationship between a beam diameter of excitation light and light that is absorbed without contributing to oscillation in the laser cavity according to an embodiment of the present invention.

FIG. 16A illustrates a light condensing profile when light emitted from an optical fiber having a core diameter of 1.5 mm is condensed to a diameter of 1.5 mm and a region not contributing to oscillation, and FIG. 16B illustrates a light condensing profile when light emitted from an optical fiber having a core diameter of 1.5 mm is condensed to a diameter of 1.0 mm and a region not contributing to oscillation. When the light is condensed to a beam waist diameter that is smaller than the core diameter of the optical fiber, the region that does not contribute to oscillation will be larger than the case of condensing the light at a magnification equal to the core diameter. That is, when the light is condensed to a beam waist diameter smaller than the core diameter of the optical fiber, the oscillation efficiency decreases.

As is clear from the above description, in the laser device 200 according to the present embodiment, the "transmission member" of the laser device according to the present invention is formed by the optical fiber 204. Furthermore, in the ignition device 301 according to the present embodiment, an "optical system that condenses the laser beam emitted from the laser device" in the ignition device according to the present invention is formed by the emission optical system 210.

As described above, the laser device 200 according to the present embodiment includes the VCSEL array 201, the first light condensing optical system 203, the optical fiber 204, the second light condensing optical system 205, and the laser cavity 206.

The VCSEL array 201 is a light source for excitation, and the light emitted from the VCSEL array 201 enters the laser cavity 206 as excitation light via the first light condensing optical system 203, the optical fiber 204, and the second light condensing optical system 205.

The laser cavity 206 is a Q-switched laser and includes the laser medium 206a and the saturable absorber 206b. The initial transmittance of the saturable absorber 206b is 0.15 to 0.70.

The excitation light is set so that the beam waist diameter r satisfies the relationship of the above formula (4).

In this case, the laser device 200 can achieve both high laser output and high oscillation efficiency.

The ignition device 301 includes the laser device 200, and therefore stable ignition can be efficiently performed.

Furthermore, the engine 300 includes the ignition device 301, and therefore as a result, efficiency can be improved.

Note that in the above embodiment, each of the first light condensing optical system 203 and the emission optical system 210 may be formed by a single optical element or a plurality of optical elements.

Furthermore, in the above embodiment, the case where the surface emitting laser array is used as the excitation light source has been described; however, the present invention is not limited as such.

Furthermore, the laser device 200 can be used for a laser annealing device and a laser processing machine.

<<Laser Annealing Device>>

Figure 17A:
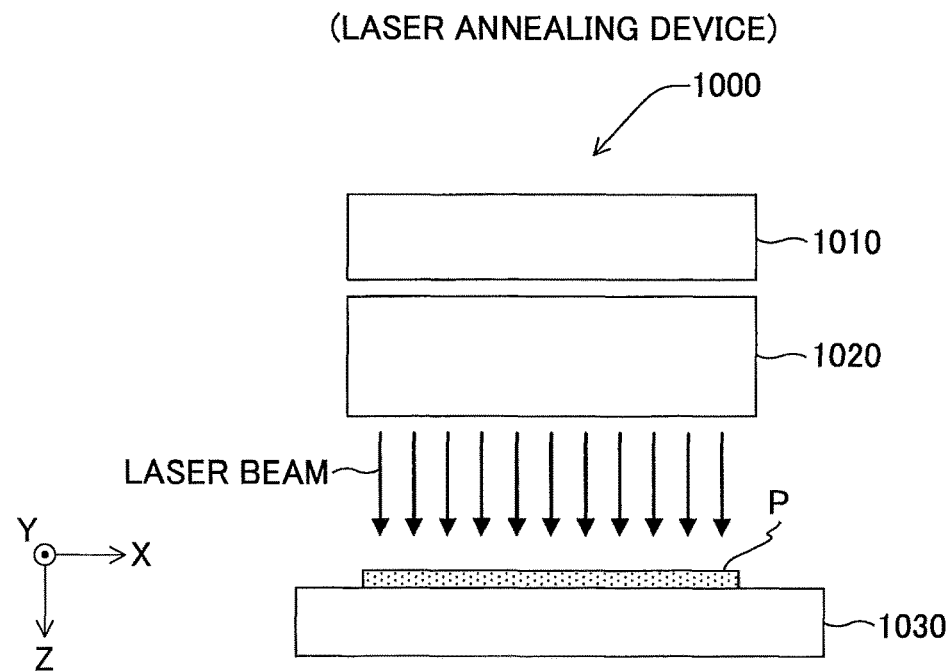
FIG. 17A is a diagram for illustrating the schematic configuration of a laser annealing device according to an embodiment of the present invention.
Figure 17B:
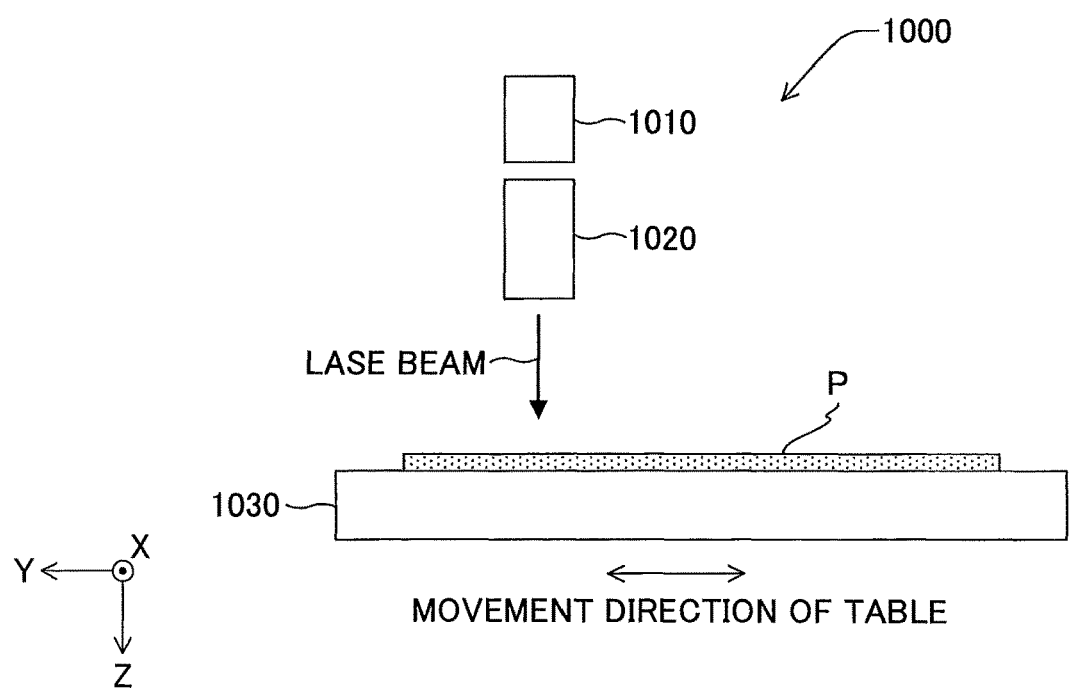
FIG. 17B is a diagram for illustrating the schematic configuration of a laser annealing device according to an embodiment of the present invention.

FIGS. 17A and 17B illustrate a schematic configuration of an example of a laser annealing device 1000 including the laser device 200. The laser annealing device 1000 includes a light source 1010, an optical system 1020, a table device 1030, and a control device (not illustrated), etc.

The light source 1010 includes the laser device 200 and can emit laser beams. The optical system 1020 guides the laser beam emitted from the light source 1010 to the surface of an object P. The table device 1030 includes a table on which the object P is placed. The table can move at least along the Y axis direction.

For example, when the object P is amorphous silicon (a-Si), and the object P is irradiated with the laser beam, the temperature of the amorphous silicon (a-Si) rises and then the amorphous silicon (a-Si) crystallizes by being gradually cooled, and the amorphous silicon (a-Si) becomes polysilicon (p-Si).

In the laser annealing device 1000, the light source 1010 includes the laser device 200, and therefore the processing efficiency can be improved.

<<Laser Processing Machine>>

Figure 18:
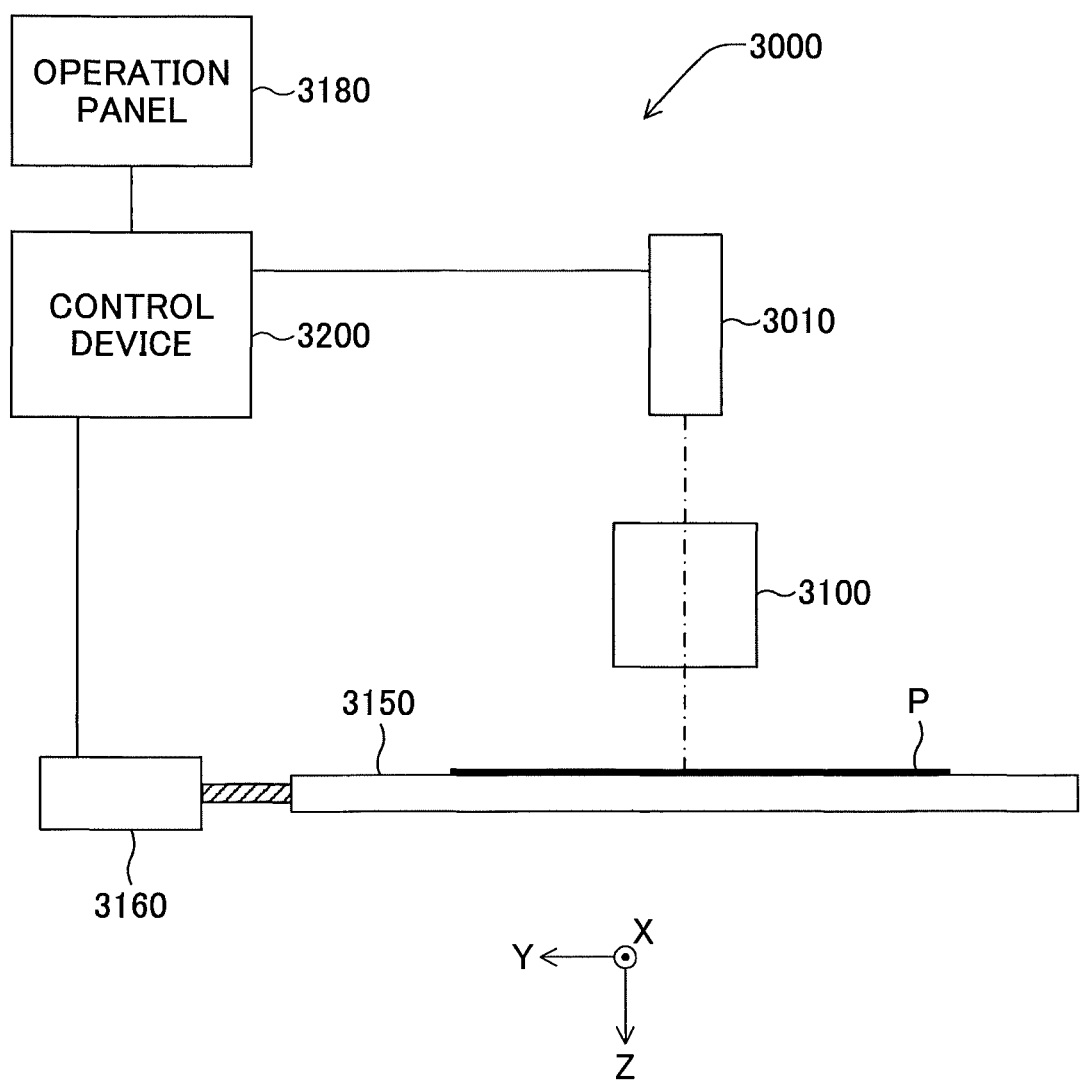
FIG. 18 is a diagram for illustrating the schematic configuration of a laser processing machine according to an embodiment of the present invention.

FIG. 18 illustrates a schematic configuration of an example of a laser processing machine 3000 including the laser device 200. The laser processing machine 3000 includes a light source 3010, an optical system 3100, a table 3150 on which the object P is placed, a table driving device 3160, an operation panel 3180, and a control device 3200, etc.

The light source 3010 includes the laser device 200 and emits a laser beam based on an instruction from the control device 3200. The optical system 3100 condenses the laser beam emitted from the light source 3010 near the surface of the object P. The table driving device 3160 moves the table 3150 in the X axis direction, the Y axis direction, and the Z axis direction based on instructions from the control device 3200.

The operation panel 3180 includes a plurality of keys for an operator to make various settings, and a display device for displaying various kinds of information. The control device 3200 controls the light source 3010 and the table driving device 3160, based on various kinds of setting information from the operation panel 3180.

In the laser processing machine 3000, the light source 3010 includes the laser device 200, and therefore the efficiency of processing (for example, cutting and welding) can be improved.

Note that the laser processing machine 3000 may include a plurality of the light sources 3010.

Furthermore, the laser device 200 is also suitable for devices using laser beams other than the laser annealing device or the laser processing device. For example, the laser device 200 may be used as a light source of a display device.

According to a laser device according to the present invention, it is possible to achieve both high laser output and high oscillation efficiency.

The laser device, the ignition device, and the internal combustion engine are not limited to the specific embodiments described in the detailed description, and variations and modifications may be made without departing from the spirit and scope of the present invention.

What is claimed is:
1. A laser device comprising:
a light source device including a semiconductor laser;
a laser cavity including a saturable absorber; and
at least one optical element that irradiates light from the light source onto the laser cavity,
wherein, when an initial transmittance of the saturable absorber is $T_0$, the at least one optical element condenses the light from the light source, so that a beam waist diameter r of the light irradiated onto the laser cavity satisfies a relationship of $7.75 \times T_0^4 - 7.77 \times T_0^3 + 3.13 \times T_0^2 + 0.16 \times T_0 + 0.74 \leq r \leq 2.62 \times T_0 + 0.675$.

2. The laser device according to claim 1, wherein the semiconductor laser includes a surface emitting laser array.

3. The laser device according to claim 1, wherein the initial transmittance $T_0$ of the saturable absorber is 0.15 to 0.70.

4. The laser device according to claim 1, wherein the light source device includes a light transmission member configured to transmit a laser beam emitted from the semiconductor laser.

5. The laser device according to claim 4, wherein the light transmission member includes an optical fiber.

6. The laser device according to claim 5, wherein the beam waist diameter r of the light that irradiates the laser cavity is greater than or equal to a core diameter of the optical fiber.

7. The laser device according to claim 4, wherein the at least one optical element is disposed on an optical path between the light transmission member and the laser cavity.

8. The laser device according to claim 1, wherein the laser cavity includes a Q-switched laser.

9. The laser device according to claim 8, wherein the laser cavity includes a laser medium.

10. The laser device according to claim 9, wherein the laser medium includes a YAG crystal doped with Nd, and the saturable absorber includes a YAG crystal doped with Cr.

11. The laser device according to claim 9, wherein the laser cavity includes a composite crystal.

12. The laser device according to claim 1, wherein the laser cavity includes ceramics.

13. An ignition device comprising:
a laser device
wherein the laser device includes
a light source device including a semiconductor laser;
a laser cavity including a saturable absorber; and
at least one optical element that irradiates light from the light source onto the laser cavity,
wherein, when an initial transmittance of the saturable absorber is $T_0$, the at least one optical element condenses the light from the light source, so that a beam waist diameter r of the light irradiated onto the laser cavity satisfies a relationship of $7.75 \times T_0^4 - 7.77 \times T_0^3 + 3.13 \times T_0^2 + 0.16 \times T_0 + 0.74 \leq r \leq 2.62 \times T_0 + 0.675$.

14. An internal combustion engine configured to generate combustion gas by combusting fuel, the internal combustion engine comprising:
an ignition device that ignites the fuel,
wherein the ignition device includes a laser device,
wherein the laser device includes
a light source device including a semiconductor laser;
a laser cavity including a saturable absorber; and
at least one optical element that irradiates light from the light source onto the laser cavity,
wherein, when an initial transmittance of the saturable absorber is $T_0$, the at least one optical element condenses the light from the light source, so that a beam waist diameter r of the light irradiated onto the laser cavity satisfies a relationship of $7.75 \times T_0^4 - 7.77 \times T_0^3 + 3.13 \times T_0^2 + 0.16 \times T_0 + 0.74 \leq r \leq 2.62 \times T_0 + 0.675$.

* * * * *